(12) United States Patent
Wu et al.

(10) Patent No.: US 9,717,162 B2
(45) Date of Patent: Jul. 25, 2017

(54) ELECTRONIC DEVICE AND HEAT DISSIPATING CASING THEREOF

(71) Applicants: FURUI PRECISE COMPONENT (KUNSHAN) CO., LTD., Kunshan (CN); Foxconn Technology Co., Ltd., New Taipei (TW)

(72) Inventors: Jia-Hong Wu, New Taipei (TW); Sheng-Liang Dai, Kunshan (CN)

(73) Assignees: FURUI PRECISE COMPONENT (KUNSHAN) CO., LTD., Kunshan (CN); Foxconn Technology Co., Ltd., New Taipei (TW)

( * ) Notice: Subject to any disclaimer, the term of this patent is extended or adjusted under 35 U.S.C. 154(b) by 277 days.

(21) Appl. No.: 14/594,309

(22) Filed: Jan. 12, 2015

(65) Prior Publication Data
US 2016/0088762 A1  Mar. 24, 2016

(30) Foreign Application Priority Data

Sep. 24, 2014  (CN) .......................... 2014 1 0492549

(51) Int. Cl.
H05K 7/00      (2006.01)
H05K 7/20      (2006.01)
G06F 1/20      (2006.01)

(52) U.S. Cl.
CPC ......... *H05K 7/20336* (2013.01); *G06F 1/203* (2013.01)

(58) Field of Classification Search
None
See application file for complete search history.

(56) References Cited

U.S. PATENT DOCUMENTS

| 7,520,315 | B2* | 4/2009 | Hou | F28D 15/046 165/104.26 |
| 2008/0283222 | A1* | 11/2008 | Chang | H01L 23/427 165/104.26 |
| 2010/0038053 | A1* | 2/2010 | Maxik | F21K 9/00 165/80.2 |
| 2010/0157534 | A1* | 6/2010 | Oniki | F28D 1/0391 361/700 |
| 2010/0212870 | A1* | 8/2010 | Wu | F28D 15/0233 165/104.26 |
| 2010/0326630 | A1* | 12/2010 | Wang | F28D 15/0233 165/104.26 |
| 2011/0174466 | A1* | 7/2011 | Liu | H01L 23/427 165/104.26 |
| 2013/0081787 | A1* | 4/2013 | Hsieh | F28D 15/02 165/104.21 |
| 2013/0327502 | A1* | 12/2013 | Chen | H01L 23/4275 165/104.21 |

FOREIGN PATENT DOCUMENTS

TW      M469730 U      1/2014

* cited by examiner

*Primary Examiner* — Courtney Smith
*Assistant Examiner* — Zhengfu Feng
(74) *Attorney, Agent, or Firm* — Steven Reiss

(57) ABSTRACT

An electronic device includes an electronic component and a heat dissipating casing configured to dissipate heat from the electronic component. The casing includes top and bottom sides of the heat dissipating casing forming a sealed chamber, and a pore structure formed within the sealed chamber. The sealed chamber is configured to receive a working medium and the pore structure is configured to absorb at least a portion of the working medium, whereby the heat generated from the electronic component is dissipated by a phase change of the working medium.

16 Claims, 6 Drawing Sheets

ELECTRONIC DEVICE AND HEAT DISSIPATING CASING THEREOF

FIELD

The subject matter herein generally relates to a heat dissipation, and especially to a heat dissipation casing used in an electronic device.

BACKGROUND

During the operation of an electric products (computers, notebooks or touch pads), chips, such as CPU, GPU produces heat. Heat has to be quickly carried away from the chips during the operation. Excessively high temperature causes the chips unable to work normally. Various cooling means, such as cooling system, have been developed for dissipating heat from the chips of an electric product.

BRIEF DESCRIPTION OF THE DRAWINGS

Implementations of the present technology will now be described, by way of example only, with reference to the attached figures.

DETAILED DESCRIPTION

Figure 1:
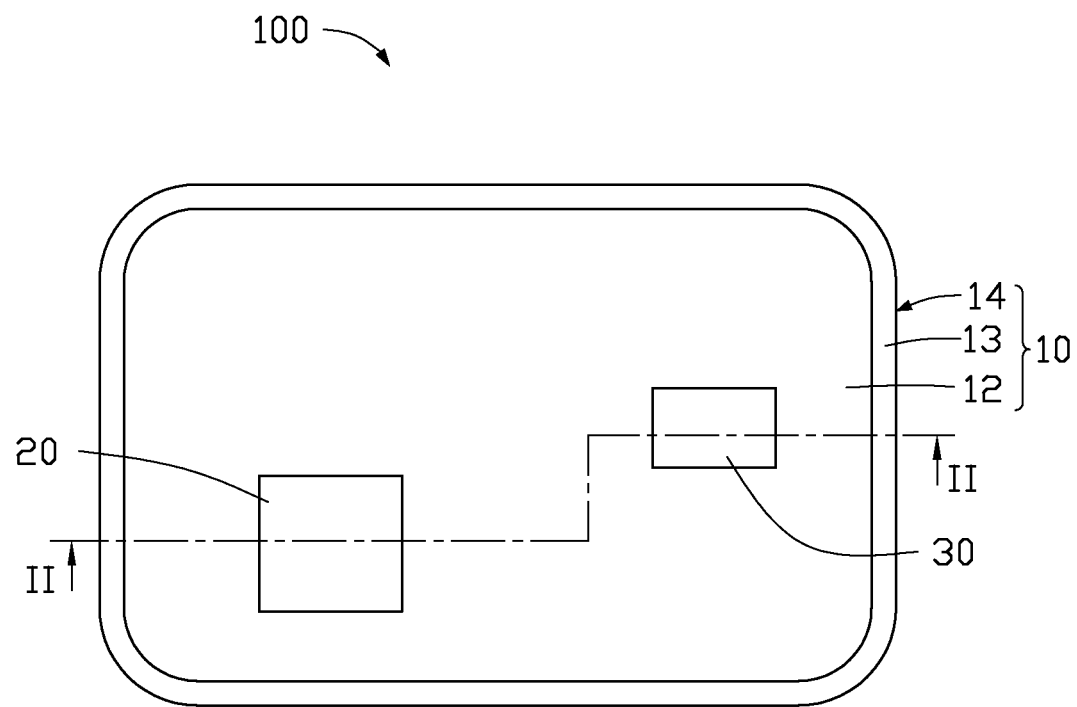
FIG. 1 is a top plan view of an electronic device in accordance with a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

Figure 2:
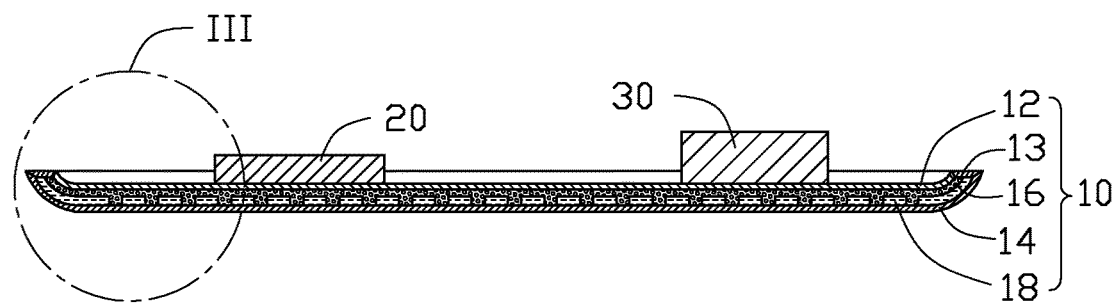
FIG. 2 is a cross sectional view of the electronic device of FIG. 1, taken along line II-II thereof.
Figure 3:
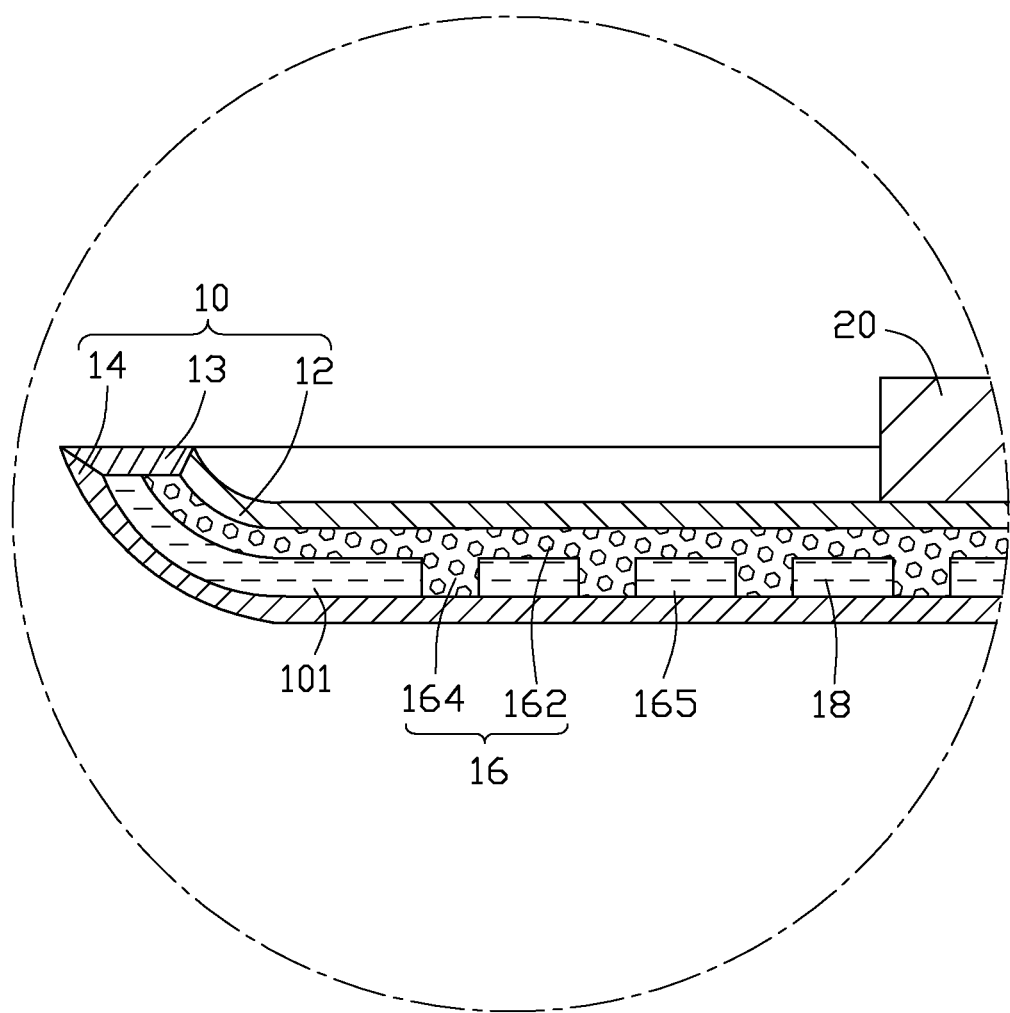
FIG. 3 is an enlarged view of a circle III shown in FIG. 2.

Referring to FIGS. 1-3, an electronic device 100 in accordance with a first embodiment of the present disclosure is shown. The electronic device 100 includes a heat dissipating casing 10, and two electronic components 20, 30 thermally attached to the heat dissipating casing 10. The heat dissipating casing 10 is capable of dissipating the heat generated from the electronic components 20, 30.

The heat dissipating casing 10 includes a top plate 12, a bottom plate 14, a pore structure 16 and a working medium 18 located between the top plate 12 and the bottom plate 14.

The top plate 12 and the bottom plate 14 can be made of metallic material with high heat conductivity, such as copper, aluminum, titanium or nickel. The top plate 12 is parallel to the bottom plate 14. The top plate 12 is located at an inner side of the electronic device 100, and the bottom plate 14 is located at an outer side of the electronic device 100. Two opposite ends of each of the top plate 12 and the bottom plate 14 slant upwardly, and each has a cross section of circular arc shape. An outer edge of the top plate 12 is coupled to an outer edge of the bottom plate 14 by an annular connecting plate 13. The pore structure 16 is sandwiched between the top plate 12 and the bottom plate 14 to support the top plate 12 and the bottom plate 14. The top plate 12, the connecting plate 13 and the bottom plate 14 cooperatively form a sealed chamber 101, and the pore structure 16 and the working medium 18 are received in the sealed chamber 101. The pore structure 16 is fixed on an inner face of the top plate 12. The two electronic components 20, 30 are fixed on an outer face of the top plate 12.

The pore structure 16 produces a capillary force for adsorbing the liquid working medium 18, and has a porosity ranged from about 35% to about 65%. The working medium 18 may be water or alcohol. The pore structure 16 includes a main portion 162 adhered on the whole inner face of the top plate 12 and a plurality of convex portions 164 extending downwards from the main portion 162 and contacting the bottom plate 14. Two opposite ends of the main portion 162 slant upwardly along the two opposite ends of each of the top plate 12 and the bottom plate 14, and each has a cross section of circular arc shape. Each of the convex portions 164 is a long narrow strip. The convex portions 164 are parallel to and spaced from each other with an equal interval. A channel 165 is formed between every two adjacent convex portions 164 for flow of the working medium 18.

In use, the temperature of the electronic device 100 rises due to the heat generated from the electronic components 20, 30. Since the electronic components 20, 30 contact the top plate 12 of the heat dissipating casing 10 intimately. The heat is transmitted to the working medium 18 by the top plate 12, so that the working medium 18 is heated and vaporized to flow downwards through the channels 165 of the pore structure 16 to the bottom plate 14. The vaporized working medium 18 exchanges heat with the bottom plate 14 and then is condensed to liquid. The condensed working medium 18 then returns to the top plate 12 of the heat dissipating casing 10. Therefore, the heat generated from the electronic components 20, 30 is dissipated continuously by above phase change cycle of the working medium 18. The whole heat dissipating casing 10 has a heat transfer coefficient larger than 10000 W/(m²*K), about 30 times as much as that of the copper material.

Figure 4:
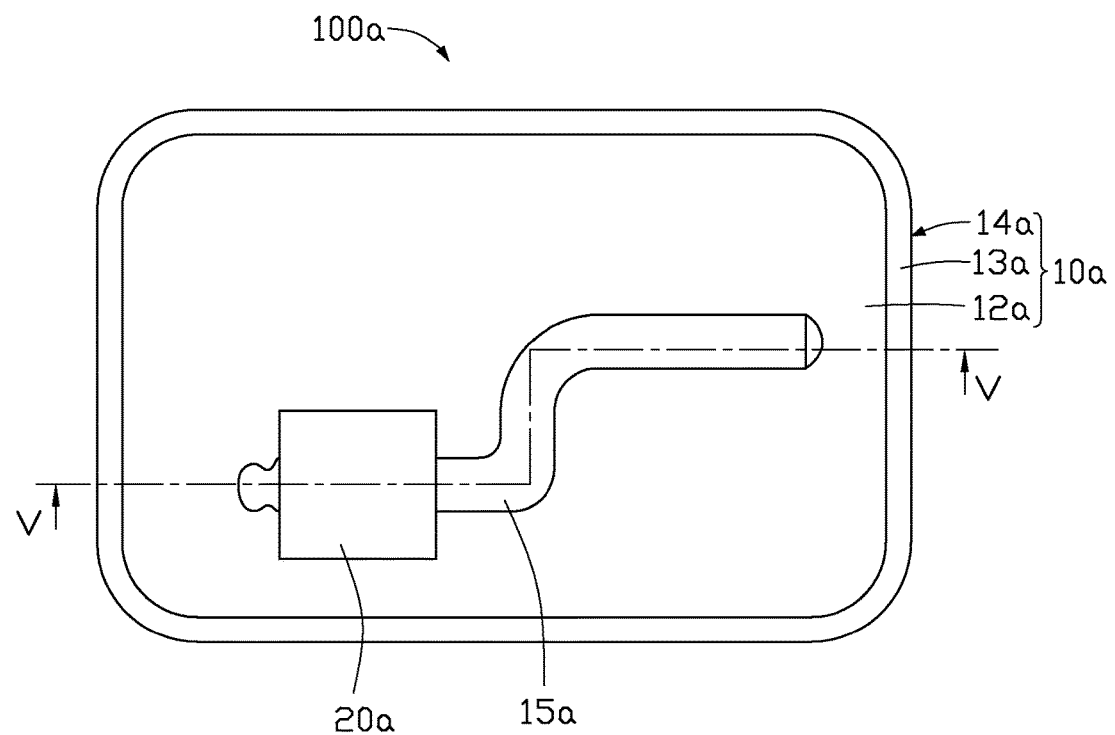
FIG. 4 is a top plan view of an electronic device in accordance with a second embodiment of the present disclosure.
Figure 5:
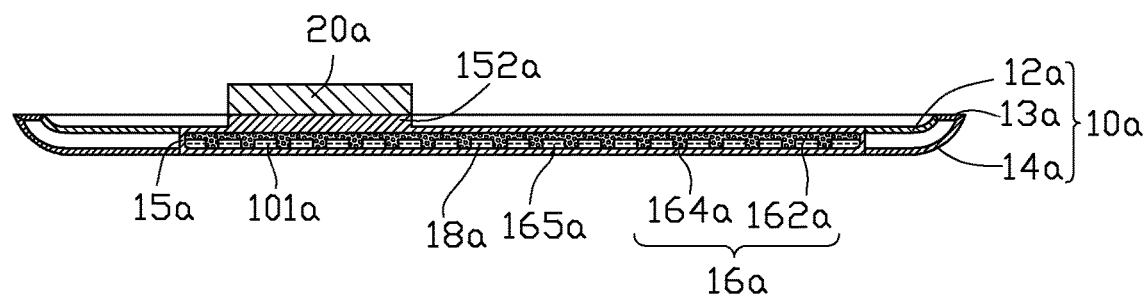
FIG. 5 is a cross sectional view of the electronic device of FIG. 4, taken along line V-V thereof.

Referring to FIGS. 4-5, an electronic device 100a in accordance with a second embodiment of the present disclosure is shown. The electronic device 100a includes a heat dissipating casing 10a, and an electronic component 20a thermally attached to the heat dissipating casing 10a. The heat dissipating casing 10a is capable of dissipating the heat generated from the electronic component 20a.

The heat dissipating casing 10a includes a top plate 12a, a bottom plate 14a, a pore structure 16a and a working medium 18a. The top plate 12a and the bottom plate 14a can be made of non-metallic material or metallic material with high heat conductivity, such as copper, aluminum, titanium or nickel. Two opposite ends of each of the top plate 12a and the bottom plate 14a slant upwardly, and each has a cross section of circular arc shape. An outer edge of the top plate 12a is coupled to an outer edge of the bottom plate 14a by an annular connecting plate 13a.

The differences between the electronic device 100a of the second embodiment and the electronic device 100 of the first embodiment are in that: the heat dissipating casing 10a further includes a sealed, flat shell 15a, in which a sealed chamber 101a is formed. The pore structure 16a and the working medium 18a are received in the sealed chamber 101a of the sealed shell 15a. The electronic component 20a is thermally attached to the sealed shell 15a.

The sealed shell 15a can be made of metallic material with high heat conductivity, such as copper, aluminum, titanium or nickel. Compared to aluminium magnesium alloy, the heat dissipating performance of the heat dissipating casing 10a increases more than 10 times. The sealed shell 15a is bent along a longitudinal direction thereof. Each of the top plate 12a and the bottom plate 14a defines a groove (not labeled), corresponding to the sealed shell 15a. The sealed shell 15a is embedded in the grooves of the top plate 12a and the bottom plate 14a. The sealed shell 15a is coupled with the top plate 12a and the bottom plate 14a by welding or molten way. A protrusion 152a protrudes from an outer face of one end of the sealed shell 15a. The electronic component 20a is thermally attached to the protrusion 152a of the sealed shell 15a. The other portion of the sealed shell 15a except for the protrusion 152a has a thickness equal to that of the heat dissipating casing 10a. The pore structure 16a is fixed on an inner face of the sealed shell 15a. The pore structure 16a includes a main portion 162a and a plurality of convex portions 164a extending downwards from the main portion 162a. Each of the convex portions 164a is a long narrow strip. The convex portions 164a are parallel to and spaced from each other with an equal interval. A channel 165a is formed between every two adjacent convex portions 164a for flow of the working medium 18a.

Figure 6:
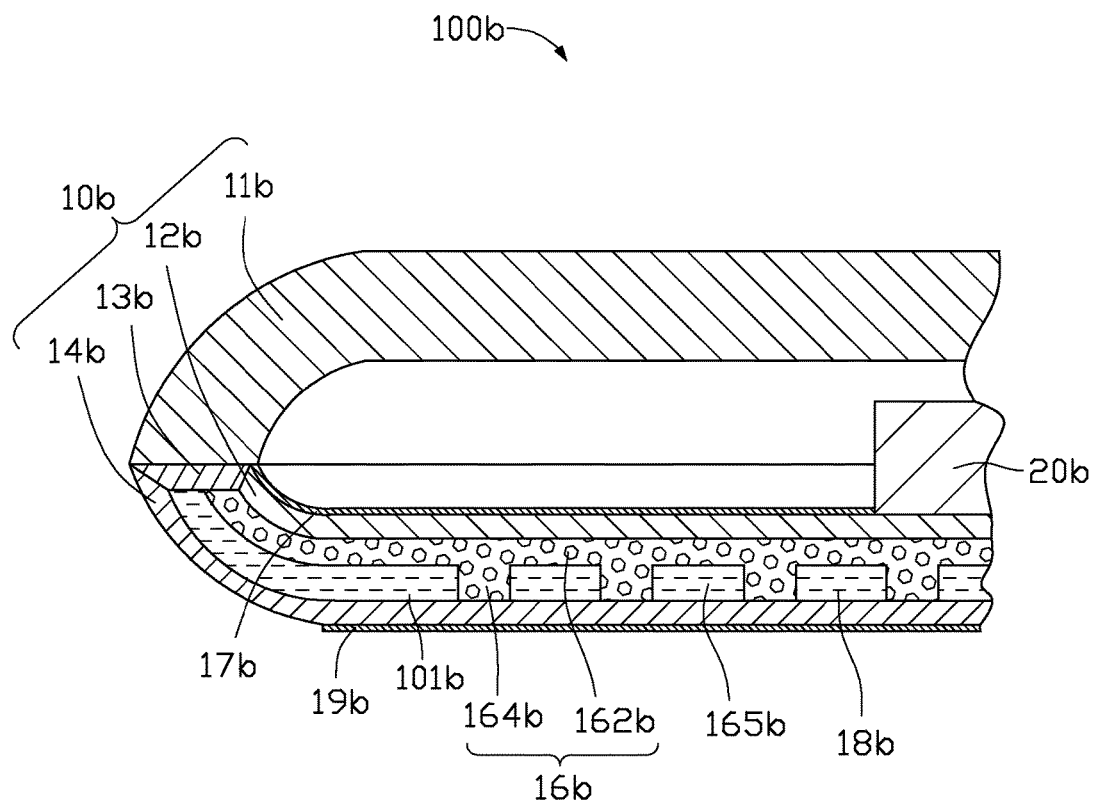
FIG. 6 is a cross sectional view of an electronic device in accordance with a third embodiment of the present disclosure.

Referring to FIG. 6, an electronic device 100b in accordance with a third embodiment of the present disclosure is shown. The electronic device 100b includes a heat dissipating casing 10b, and an electronic component 20b thermally attached to the heat dissipating casing 10b. The heat dissipating casing 10b is capable of dissipating the heat generated from the electronic component 20b.

The heat dissipating casing 10b is a sealed structure, and includes a top plate 12b, a bottom plate 14b, a pore structure 16b and a working medium 18b located between the top plate 12b and the bottom plate 14b. An outer edge of the top plate 12b is coupled to an outer edge of the bottom plate 14b by an annular connecting plate 13b. The top plate 12b, the connecting plate 13b and the bottom plate 14b cooperatively form a sealed chamber 101b, and the pore structure 16b and the working medium 18b are received in the sealed chamber 101b. The two electronic component 20b is fixed on an outer face of the top plate 12b.

The pore structure 16b includes a main portion 162b adhered on the whole inner face of the top plate 12b and a plurality of convex portions 164b extending downwards from the main portion 162b and contacting the bottom plate 14b. A channel 165b is formed between every two adjacent convex portions 164b for flow of the working medium 18b.

The differences between the electronic device 100b of the third embodiment and the electronic device 100 of the first embodiment are in that: the heat dissipating casing 10b further includes two heat insulating layers 17b, 19b and a cover 11b.

In use, the temperature of a part of the electronic device 100b adjacent to the electronic component 20b rises rapidly due to the heat generated from the electronic component 20b, while the other part of the electronic device 100b far from the electronic component 20b has a lower temperature. As a result, the heat in the outer face of the heat dissipating casing 10b returns back to an interior of the heat dissipating casing 10b, and the temperature of the interior of the heat dissipating casing 10b rises continuously. To solve above problem, the heat insulating layer 17b is adhered on the top plate 12b of the heat dissipating casing 10b and surrounds the electronic component 20b.

A user may contact a bottom of the heat dissipation casing 10b, thus a position of the bottom plate 14b of the heat dissipation casing 10b where hands of the user may touch directly is covered by the heat insulating layer 19b, thereby preventing the hands of the user feeling high temperature of the bottom of the heat dissipation casing 10b.

The heat insulating layers 17b, 19b may be an insulating tape, a solidified gas gel layer, or a hollow film.

The cover 11b covers the top plate 12b and the bottom plate 14b, the cover 11b and the top plate 12b cooperatively form a sealed room (not labeled) for receiving the electronic component 20b therein.

In the above embodiments, the electronic device 100, 100a, 100b may be notebook computer.

According to the present disclosure, since the heat dissipating casing 10, 10a, 10b defines a sealed chamber therein, and the working medium 18, 18a, 18b and the pore structure 16, 16a, 16b for absorbing the working medium 18, 18a, 18b are received in the chamber, thus the heat generated from the electronic components 20, 30, 20a, 20b is dissipated by the phase change cycle of the working medium 18, 18a, 18b. Both the higher heat radiating efficiency and the demand for ultra-thin electronic products are obtained.

The embodiments shown and described above are only examples. Many details are often found in the art such as the other features of an electronic device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A heat dissipating casing configured to dissipate heat from an electronic component, the casing comprising:
   top and bottom sides of the heat dissipating casing forming a sealed shell; and
   a pore structure formed within the sealed shell;
   wherein the sealed shell is configured to receive a working medium and the pore structure is configured to absorb at least a portion of the working medium, whereby the heat generated from the electronic component is dissipated by a phase change of the working medium, wherein further comprising a top plate and a bottom plate, the pore structure and the working medium being sandwiched between the top plate and the bottom plate, the pore structure is fixed on an inner face of the top plate, the electronic component being fixed on an outer face of the top plate, the pore structure comprising a main portion adhered on the whole inner face of the top plate and a plurality of convex portions extending downwards from the main portion and contacting the bottom plate, a channel being formed between every two adjacent convex portions for flow of the working medium.

2. The heat dissipating casing of claim 1, further comprising a top plate, a bottom plate and the sealed shell, each of the top plate and the bottom plate defining a groove, the sealed shell being embedded in the grooves of the top plate and the bottom plate, the electronic component being thermally attached to the sealed shell, a sealed chamber being formed in an interior of the sealed shell.

3. The heat dissipating casing of claim 2, wherein a protrusion protrudes from an outer face of one end of the sealed shell, the electronic component being thermally attached to the protrusion of the sealed shell.

4. The heat dissipating casing of claim 1, wherein each of the top plate and the bottom plate is made of copper, aluminum, titanium or nickel.

5. The heat dissipating casing of claim 1, wherein two opposite ends of each of the top plate and the bottom plate slant upwardly, and each of the two opposite ends has a cross section of circular arc shape.

6. The heat dissipating casing of claim 5, wherein an outer edge of the top plate is coupled to an outer edge of the bottom plate by an annular connecting plate, the top plate, the connecting plate and the bottom plate cooperatively forming the sealed shell.

7. The heat dissipating casing of claim 1, wherein a heat insulating layer is adhered on the top plate and surrounds the electronic component.

8. The heat dissipating casing of claim 7, wherein the bottom plate is covered by a heat insulating layer.

9. The heat dissipating casing of claim 1, further comprising a cover covering the top plate and the bottom plate, the cover and the top plate cooperatively forming a sealed room for receiving the electronic component therein.

10. An electronic device, comprising:
an electronic component; and
a heat dissipating casing configured to dissipate heat from the electronic component, the casing comprising:
top and bottom sides of the heat dissipating casing forming a sealed shell; and
a pore structure formed within the sealed shell;
wherein the sealed shell is configured to receive a working medium and the pore structure is configured to absorb at least a portion of the working medium, whereby the heat generated from the electronic component is dissipated by a phase change of the working medium, wherein the heat dissipating casing further comprising a top plate and a bottom plate, the pore structure and the working medium being sandwiched between the top plate and the bottom plate, the pore structure is fixed on an inner face of the top plate, the electronic component being fixed on an outer face of the top plate, the pore structure comprising a main portion adhered on the whole inner face of the top plate and a plurality of convex portions extending downwards from the main portion and contacting the bottom plate, a channel being formed between every two adjacent convex portions for flow of the working medium.

11. The electronic device of claim 10, wherein the heat dissipating casing further comprising a top plate, a bottom plate and a sealed shell, each of the top plate and the bottom plate defining a groove, the sealed shell being embedded in the grooves of the top plate and the bottom plate, the electronic component being thermally attached to the sealed shell, a sealed chamber being formed in an interior of the sealed shell.

12. The electronic device of claim 11, wherein a protrusion protrudes from an outer face of one end of the sealed shell, the electronic component being thermally attached to the protrusion of the sealed shell.

13. The electronic device of claim 10, wherein two opposite ends of each of the top plate and the bottom plate slant upwardly, and each of the two opposite ends has a cross section of circular arc shape.

14. The electronic device of claim 13, wherein an outer edge of the top plate is coupled to an outer edge of the bottom plate by an annular connecting plate, the top plate, the connecting plate and the bottom plate cooperatively forming the sealed shell.

15. The electronic device of claim 10, wherein a heat insulating layer is adhered on the top plate and surrounds the electronic component.

16. The electronic device of claim 10, wherein the heat dissipating casing further comprising a cover covering the top plate and the bottom plate, the cover and the top plate cooperatively forming a sealed room for receiving the electronic component therein.

* * * * *